(12) United States Patent
Kaneko et al.

(10) Patent No.: US 11,505,861 B2
(45) Date of Patent: Nov. 22, 2022

(54) SUBSTRATE GUIDE AND CARRIER

(71) Applicant: ULVAC, INC., Chigasaki (JP)

(72) Inventors: Toshinori Kaneko, Chigasaki (JP); Tetsuhiro Ohno, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 355 days.

(21) Appl. No.: 16/321,646

(22) PCT Filed: Jun. 7, 2018

(86) PCT No.: PCT/JP2018/021888
§ 371 (c)(1),
(2) Date: Jan. 29, 2019

(87) PCT Pub. No.: WO2018/225826
PCT Pub. Date: Dec. 13, 2018

(65) Prior Publication Data
US 2021/0277514 A1 Sep. 9, 2021

(30) Foreign Application Priority Data

Jun. 8, 2017 (JP) .............................. JP2017-113650

(51) Int. Cl.
*C23C 14/50* (2006.01)
*B65G 49/06* (2006.01)
(52) U.S. Cl.
CPC ............ *C23C 14/50* (2013.01); *B65G 49/061* (2013.01)
(58) Field of Classification Search
None
See application file for complete search history.

(56) References Cited

U.S. PATENT DOCUMENTS

| 8,550,441 B2 * | 10/2013 | Ishino | .................. B65G 49/062 269/254 R |
|---|---|---|---|
| 2010/0117280 A1 | 5/2010 | Ishino et al. | |
| 2016/0257504 A1 | 9/2016 | Fukuta | |
| 2019/0376177 A1* | 12/2019 | Butler | ................. C23C 16/4588 |

FOREIGN PATENT DOCUMENTS

| CN | 103726010 | 4/2014 |
|---|---|---|
| JP | 2004-296672 | 10/2004 |

(Continued)

OTHER PUBLICATIONS

Machine Translation of JP 2007262539 A (Year: 2007).*

(Continued)

*Primary Examiner* — Shamim Ahmed
*Assistant Examiner* — Bradford M Gates
(74) *Attorney, Agent, or Firm* — Grossman, Tucker, Perreault & Pfleger, PLLC

(57) ABSTRACT

A substrate guide of the present invention is provided on a carrier frame of a carrier which holds a substrate substantially vertically so that a surface of the substrate is in a substantially vertical direction and supports the substrate by being in contact with at least a peripheral edge end surface portion of the substrate. The substrate guide includes a base attached to the carrier frame, a substrate support which comes into contact with the peripheral edge end surface portion of the substrate held by the carrier and is attached to the base to be movable in a normal direction of the peripheral edge end surface portion in a direction parallel to the surface of the substrate, and a force-applying member which applies a force to the substrate support toward the substrate with respect to the base.

10 Claims, 11 Drawing Sheets

(56) References Cited

FOREIGN PATENT DOCUMENTS

| | | |
|---|---|---|
| JP | 2004-315146 | 11/2004 |
| JP | 2005-272113 | 10/2005 |
| JP | 2006-114675 | 4/2006 |
| JP | 2007-262539 | 10/2007 |
| JP | 2011-108822 | 6/2011 |
| KR | 10-0174985 | 4/1999 |
| TW | 200906692 | 2/2009 |
| TW | 201132556 | 10/2011 |
| TW | 201241956 | 10/2012 |
| TW | 201246434 | 11/2012 |
| WO | 2008/133149 | 11/2008 |
| WO | 2015/064374 | 5/2015 |

OTHER PUBLICATIONS

Office Action from related Taiwanese Application No. 107119845, dated May 13, 2019. English translation attached.
Notice of Allowance from related Korean Application No. 10-2019-7002525, dated Oct. 19, 2020. English translation attached.
Office Action from related Korean Application No. 10-2019-7002525, dated Jul. 27, 2020. English translation attached.
International Search Report from corresponding PCT Application No. PCT/JP2018/021888 dated Aug. 21, 2018. English translation attached.
Office Action from related Japanese Application No. 2018-560681, dated Jul. 2, 2019. English translation attached.
Office Action from related China Application No. 2018800029345, dated Aug. 16, 2022, with English translation.

* cited by examiner

SUBSTRATE GUIDE AND CARRIER

TECHNICAL FIELD

The present invention relates to a substrate guide and a carrier, and more particularly to a technology suitably used for preventing occurrence of breakage or the like of a substrate in vertical transfer.

Priority is claimed on Japanese Patent Application No. 2017-113650, filed in Japan on Jun. 8, 2017, the content of which is incorporated herein by reference.

BACKGROUND ART

For example, in a manufacturing process of a liquid crystal display, a thin film transistor (TFT) is formed on a substrate made of glass or the like. In formation of the TFT, film formation apparatuses (sputtering apparatus) for performing a heat treatment, a deposition process, and the like on a glass substrate in a vacuum environment are used.

In recent years, as liquid crystal displays have become larger in size, a carrier circulation type in-line sputtering apparatuses has been used as a film formation apparatus. This carrier circulation type in-line sputtering apparatus includes a preparation chamber in which a glass substrate is introduced into a vacuum, a deposition chamber in which a sputtering target is disposed, and an extraction chamber for returning the glass substrate from a vacuum state to the atmosphere, and the like. Then, the glass substrate is placed on a transfer truck called a carrier and is moved between chambers constituting the in-line sputtering apparatus (see Patent Document 1, for example).

Also, for a sputtering apparatus, a configuration of a vertical type single-wafer-processing apparatus (fixed film formation apparatus) or an inter-back type sputtering apparatus is also known.

In an inter-back type sputtering apparatus, one chamber serves as both a preparation chamber into which a glass substrate is introduced and an extraction chamber from which the glass substrate is extracted.

Regarding a carrier on which a glass substrate is placed, in order to keep an installation area of an in-line sputtering apparatus to a minimum, a so-called vertical carrier in which a glass substrate is held in a state of standing in a substantially vertical direction is increasingly used. Such a vertical carrier includes a frame that holds a peripheral edge portion of a glass substrate by being in contact therewith. In this frame, an opening for exposing one deposition surface side of the glass substrate is formed.

When a glass substrate is loaded into an in-line sputtering apparatus, for example, a horizontally placed glass substrate is picked up by an articulated robot arm having a suction disc or the like. Next, the glass substrate is rotated in a state of standing in a vertical direction, and the glass substrate is rested on a frame of the carrier. When the articulated robot arm releases the suction of the glass substrate, the glass substrate sinks to a position at which a bottom side of the glass substrate comes into contact with a receiving portion at a lower end of the frame due to a weight thereof. Thereafter, a peripheral edge portion of a substrate surface of the glass substrate is pressed by the frame and gripped by clamps or the like attached to the frame.

Also, the glass substrate in a state of being placed in the carrier repeats being accelerated and decelerated when moving between respective chambers of the in-line sputtering apparatus.

In an inter-back type sputtering apparatus, a horizontally maintained glass substrate is received from a transfer machine, and thereafter, the glass substrate is placed in a state of standing in a vertical direction, and the glass substrate is transferred.

In a step of placing a glass substrate on a vertical carrier, there are cases in which a deviation of approximately several millimeters is caused in a placement position of the glass substrate due to constraints of driving precision of the articulated robot arm. While a glass substrate has a tolerance (dimensional error) of approximately 0.1%, in a large glass substrate with one side of several meters, for example, this appears as a variation of several millimeters even with the tolerance of 0.1%.

Also, in a large glass substrate with one side of several meters, the weight thereof may reach several kilograms to several tens of kilograms, and the thickness thereof may be extremely thin and on the millimeter order or 0.1 mm order. Therefore, a load of an extremely large glass substrate is applied to an end surface of the glass substrate in vertical transfer.

PRIOR ART DOCUMENTS

Patent Documents (Patent Document 1) Japanese Unexamined Patent Application, First Publication No. 2006-114675

SUMMARY OF THE INVENTION

Problems to be Solved by the Invention

In an in-line sputtering apparatus in which a glass substrate is vertically transferred in manufacture of a liquid crystal display or the like, when breakage or the like occurs in the glass substrate, it is necessary to stop the entire manufacturing line. When a period of operation stoppage occurs in the manufacturing line, significant deterioration in workability is caused. Therefore, there is a demand to prevent occurrence of breakage in glass substrates which causes operation stoppage in manufacturing lines.

In regards to places on a glass substrate in which breakage/cracking occur in vertical transfer, since breakage/cracking often occur near a substrate support which is at a lower position on a carrier to which a weight of the substrate is applied, there is a particularly strong demand to solve this problem.

Also, as a case in which breakage/cracking occur in a glass substrate, when acceleration and deceleration are repeated with the glass substrate placed on a carrier, since breakage/cracking may occur also at a position near a substrate position restricting portion which is at front and rear positions of the carrier, there is a demand to solve this problem.

The present invention has been made in view of the above circumstances, and it is intended to achieve an object of curtailing occurrence of breakage/cracking in a glass substrate placed on a carrier in vertical transfer.

Means for Solving the Problems

The present inventors have conducted intensive research and found out that the following matters relate to a cause of breakage in a glass substrate.

When a substrate is transferred by a carrier or when a substrate is replaced with respect to the carrier, there are cases in which movement or rubbing of the substrate occurs with respect to the carrier. In this way, when movement or rubbing impact of the substrate with respect to the carrier occurs, there is a likelihood of damage to an end surface of the substrate. Since the thickness of a glass substrate transferred by a carrier of a vertical transfer is extremely thin, damage to an end surface of the substrate is extremely large. Therefore, breakage occurs in the glass substrate due to the damage. Therefore, the present inventors have realized the present invention, particularly as a configuration capable of reducing damage to a substrate in a substrate support positioned at a lower position on a carrier in which such a problem occurs. Further, the present inventors researched the same also for a case in which acceleration and deceleration are repeated with the glass substrate placed on the carrier, and realized the present invention.

A substrate guide according to a first aspect of the present invention is provided on a carrier frame of a carrier which holds a substrate substantially vertically so that a surface of the substrate is in a substantially vertical direction and supports the substrate by being in contact with at least a peripheral edge end surface portion of the substrate, and, in order to solve the above problem, the substrate guide includes a base attached to the carrier frame, a substrate support which comes into contact with the peripheral edge end surface portion of the substrate held by the carrier and is attached to the base to be movable in a normal direction of the peripheral edge end surface portion in a direction parallel to the surface of the substrate, and a force-applying member which applies a force to the substrate support toward the substrate with respect to the base.

In the substrate guide according to the first aspect of the present invention, it is more preferable that the substrate support include a planar support along the peripheral edge end surface portion.

In the substrate guide according to the first aspect of the present invention, the substrate support and the base can include movement position restricting sliding surfaces that slide relative to each other in a direction perpendicular to the planar support.

In the substrate guide according to the first aspect of the present invention, the base may include a contact portion which comes into contact with the surface of the substrate adjacent to the peripheral edge end surface portion when the substrate is placed on the substrate support, and the contact portion may extend in a direction away from the planar support in a moving direction of the substrate support.

In the substrate guide according to the first aspect of the present invention, the base can have a contour shape separated from the planar support in the moving direction of the substrate support except for the contact portion.

In the substrate guide according to the first aspect of the present invention, it is preferable that a surface separated from the substrate in a direction along the surface of the substrate be connected to an end portion of the planar support separated from the contact portion.

In the substrate guide according to the first aspect of the present invention, a length of the substrate support in a direction from the peripheral edge end surface portion toward a position separated from the contact portion can be set such that the substrate support covers the base.

In the substrate guide according to the first aspect of the present invention, the force-applying member can be provided at least at both end positions of the planar support of the substrate support in a peripheral direction of the peripheral edge end surface portion.

In the substrate guide according to the first aspect of the present invention, the substrate support and the base can include an accommodating recess in which an end portion of the force-applying member is accommodated.

In the substrate guide according to the first aspect of the present invention, the force-applying member is a columnar coil spring, and a central axis of the coil spring can be disposed at a position intersecting the planar support.

In the substrate guide according to the first aspect of the present invention, the force-applying member is a columnar coil spring, and a central axis of the coil spring may be disposed at a position closer to the contact portion than the movement position restricting sliding surface is.

In the substrate guide according to the first aspect of the present invention, the force-applying member is a columnar coil spring, and an edge portion of the coil spring is disposed at a position further away from the contact portion than from the movement position restricting sliding surface.

A carrier according to a second aspect of the present invention holds a substrate substantially vertically so that a surface of the substrate is in a substantially vertical direction, and the carrier includes a carrier frame supporting the substrate by being in contact with at least a peripheral edge portion of the substrate, in which a plurality of substrate guides described in any one of the above can be disposed in the carrier frame.

The substrate guide according to a first aspect of the present invention is provided on a carrier frame of a carrier which holds a substrate substantially vertically so that a surface of the substrate is in a substantially vertical direction and supports the substrate by being in contact with at least a peripheral edge end surface portion of the substrate, and the substrate guide includes a base attached to the carrier frame, a substrate support which comes into contact with the peripheral edge end surface portion of the substrate held by the carrier and is attached to the base to be movable in a normal direction of the peripheral edge end surface portion in a direction parallel to the surface of the substrate, and a force-applying member which applies a force to the substrate support toward the substrate with respect to the base. Thus, when the substrate is placed on the carrier, the substrate support with which the peripheral edge end surface portion of the substrate is in contact can be moved in a direction extending toward a periphery of the frame which is a direction in which a load is applied to the carrier frame (base). Therefore, an impact on the peripheral edge end surface portion of the substrate can be alleviated, and the substrate support with which the peripheral edge end surface portion of the substrate is in contact is movable with respect to the base integrated with the carrier frame even when the carrier is moved in a state in which the substrate is placed in the carrier. Thus, it is possible to alleviate an impact on the peripheral edge end surface portion of the substrate, thereby making it possible to sufficiently curtail occurrence of breakage/defects in the substrate.

Further, in the substrate guide according to the first aspect of the present invention, both the direction of a surface of the substrate and the direction of the peripheral edge end surface portion of the substrate mean directions in a state in which the surface of the substrate is held in the vertical direction. Also, the substrate has a substantially rectangular contour shape.

In the substrate guide according to the first aspect of the present invention, the substrate support includes a planar support along the peripheral edge end surface portion. Thus, since the planar support is a flat surface and no protrusion is provided, when the substrate is placed on the carrier, the planar support extends in a direction in which the peripheral edge end surface portion of the substrate moves. Therefore, it is possible to prevent occurrence of breakage/defects in the substrate caused by the peripheral edge end surface portion of the substrate being caught by the planar support.

In the substrate guide according to the first aspect of the present invention, the substrate support and the base include movement position restricting sliding surfaces that slide relative to each other in a direction perpendicular to the planar support. Thereby, the substrate support and the base can slide along the movement position restricting sliding surfaces in a direction perpendicular to the planar support. Therefore, when the substrate is placed on the carrier or when the carrier is moved in a state in which the substrate is placed thereon, it is possible to alleviate a load/impact on the substrate in the in-plane direction and to prevent occurrence of breakage/defects in the substrate.

Further, the movement position restricting sliding surfaces can be provided in a direction parallel to the surface of the substrate.

Further, the movement position restricting sliding surfaces can also be provided in a direction perpendicular to the surface of the substrate.

In the substrate guide according to the first aspect of the present invention, the base includes a contact portion which comes into contact with the surface of the substrate adjacent to the peripheral edge end surface portion when the substrate is placed on the substrate support and the contact portion extends in a direction away from the planar support in a moving direction of the substrate support. Thereby, since the surface (surface) of the substrate does not come into direct contact with the carrier frame, problems occurring in the substrate due to being in contact with the carrier frame such as a substrate temperature state can be avoided. Further, since the contact portion is provided on the base, in a state in which the peripheral edge end surface portion is in contact with the substrate support, the substrate can be placed on the substrate support by restricting a position of the substrate with respect to the substrate guide at a position at which the surface of the substrate is in contact with the contact portion.

In the substrate guide according to the first aspect of the present invention, the base has a contour shape separated from the planar support in the moving direction of the substrate support except for the contact portion. Thereby, when the substrate is placed on the substrate support, in a state in which the peripheral edge end surface portion is in contact with the substrate support, any portion other than the contact portion constituting the base does not come into contact with the substrate. Therefore, when the substrate is placed on the carrier, since the peripheral edge end surface portion of the substrate does not come into contact with any portion other than the planar support in a moving direction thereof, it is possible to prevent occurrence of breakage/defects in the substrate caused by any portion of the substrate other than the peripheral edge end surface portion being caught by the base.

In the substrate guide according to the first aspect of the present invention, a surface separated from the substrate in a direction along the surface of the substrate is connected to an end portion of the planar support separated from the contact portion. Thus, when the substrate is placed on the carrier, since the surface extending from the planar support is formed to be separated from the substrate before the peripheral edge end surface portion of the substrate comes into contact with the planar support, the peripheral edge end surface portion of the substrate does not come into contact with any portion other than the planar support in front of the planar support in a moving direction thereof. Thereby, it is possible to prevent occurrence of breakage/defects in the substrate caused by any portion other than the peripheral edge end surface portion of the substrate being caught by the substrate support.

In the substrate guide according to the first aspect of the present invention, a length of the substrate support in a direction from the peripheral edge end surface portion toward a position separated from the contact portion is set such that the substrate support covers the base. Accordingly, when the substrate is placed on the carrier, since the peripheral edge end surface portion of the substrate comes into contact with only the substrate support and does not come into contact with the base, it is possible to prevent occurrence of breakage/defects in the substrate caused by the peripheral edge end surface portion of the substrate coming into contact with the base.

In the substrate guide according to the first aspect of the present invention, the force-applying member is provided at least at both end positions of the planar support of the substrate support in a peripheral direction of the peripheral edge end surface portion. Thus, since the substrate support is supported by the base at both ends at which the force-applying members are disposed, the substrate support is prevented from being inclined in the in-plane direction of the substrate and the substrate support can move only in a direction perpendicular to the planar support. Thereby, when the substrate is placed on the carrier or when the carrier is moved in a state in which the substrate is placed thereon, occurrence of breakage/defects in the substrate can be prevented by preventing a local load from being applied to the peripheral edge end surface portion of the substrate.

In the substrate guide according to the first aspect of the present invention, the substrate support and the base include an accommodating recess in which an end portion of the force-applying member is accommodated. Accordingly, the force-applying member is prevented from being deviated with respect to the substrate support and the force-applying member is prevented from being deviated with respect to the base, and thereby it is possible to prevent a moving direction of the substrate support to the base from fluctuating. Thereby, when the substrate is placed on the carrier or when the carrier is moved in a state in which the substrate is placed thereon, occurrence of breakage/defects in the substrate can be prevented by preventing a local load from being applied to the peripheral edge end surface portion of the substrate.

In the substrate guide according to the first aspect of the present invention, the force-applying member is a columnar coil spring, and a central axis of the coil spring is disposed at a position intersecting the planar support. Thereby, the substrate support is prevented from being inclined in a normal direction of the surface of the substrate so that the substrate support can move only in a direction perpendicular to the planar support. Thereby, when the substrate is placed on the carrier or when the carrier is moved in a state in which the substrate is placed thereon, occurrence of breakage/defects in the substrate can be prevented by preventing a local load from being applied to the peripheral edge end surface portion of the substrate.

In the substrate guide according to the first aspect of the present invention, the force-applying member is a columnar coil spring, and a central axis of the coil spring is disposed at a position closer to the contact portion than the movement position restricting sliding surface is. Thereby, the substrate support is prevented from being inclined in a normal direction of the surface of the substrate so that the substrate support can move only in a direction perpendicular to the planar support. Thereby, when the substrate is placed on the carrier or when the carrier is moved in a state in which the substrate is placed thereon, occurrence of breakage/defects in the substrate can be prevented by preventing a local load from being applied to the peripheral edge end surface portion of the substrate.

In the substrate guide according to the first aspect of the present invention, the force-applying member is a columnar coil spring, and an edge portion of the coil spring is disposed at a position further away from the contact portion than from the movement position restricting sliding surface. Thereby, the substrate support is prevented from being inclined in a normal direction of the surface of the substrate so that the substrate support can move only in a direction perpendicular to the planar support. Thereby, when the substrate is placed on the carrier or when the carrier is moved in a state in which the substrate is placed thereon, occurrence of breakage/defects in the substrate can be prevented by preventing a local load from being applied to the peripheral edge end surface portion of the substrate.

A carrier according to a second aspect of the present invention is a carrier that holds a substrate substantially vertically so that a surface of the substrate is in a substantially vertical direction, and the carrier includes a carrier frame supporting the substrate by being in contact with at least a peripheral edge portion of the substrate, in which a plurality of substrate guides described in any one of the above are disposed in the carrier frame. Thereby, when the substrate is placed on the carrier or when the carrier is moved in a state in which the substrate is placed thereon, occurrence of breakage/defects in the substrate can be prevented by preventing a local load from being applied to the peripheral edge end surface portion of the substrate.

The substrate guide is provided at a lower portion of the carrier frame or at front and rear positions in a traveling direction of the carrier. Thereby, when the substrate is placed on the carrier or when the carrier is moved in a state in which the substrate is placed thereon, it is possible to prevent a local load from being applied to the peripheral edge end surface portion of the substrate in the lower portion of the substrate. Further, a local load is prevented from being applied to peripheral edge end surface portions of the substrate which are the front and rear positions in a traveling direction of the carrier, and thereby occurrence of breakage/defects in the substrate can be prevented.

Effects of the Invention

According to the aspects of the present invention, it is possible to achieve an effect that occurrence of breakage/defects in the substrate can be prevented by preventing a local load from being applied to the peripheral edge end surface portion of the substrate.

DETAILED DESCRIPTION

First Embodiment

Hereinafter, a substrate guide and a carrier according to a first embodiment of the present invention will be described with reference to the drawings.

Figure 1:
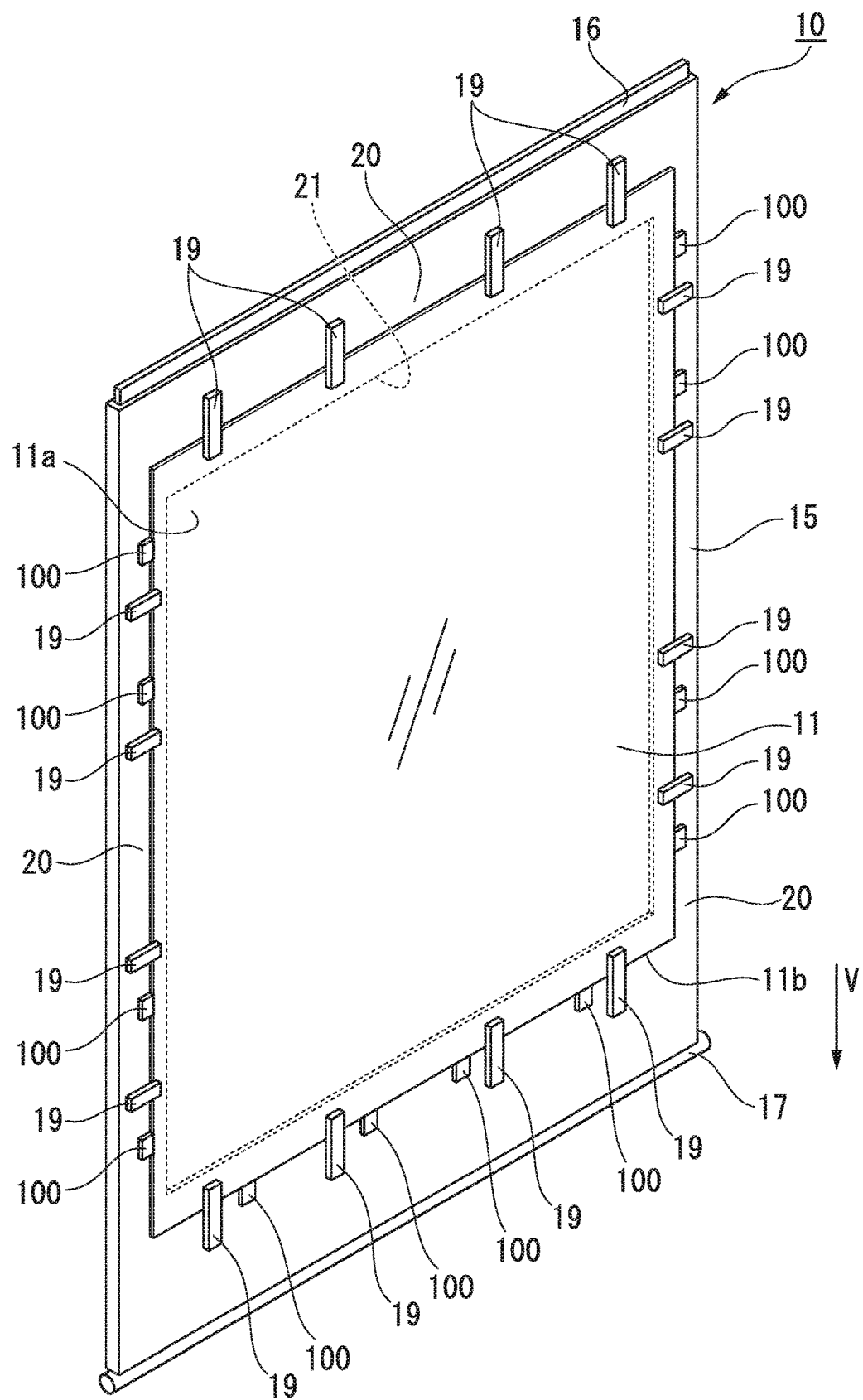
FIG. 1 is a perspective view showing a carrier according to a first embodiment of the present invention.
Figure 2:
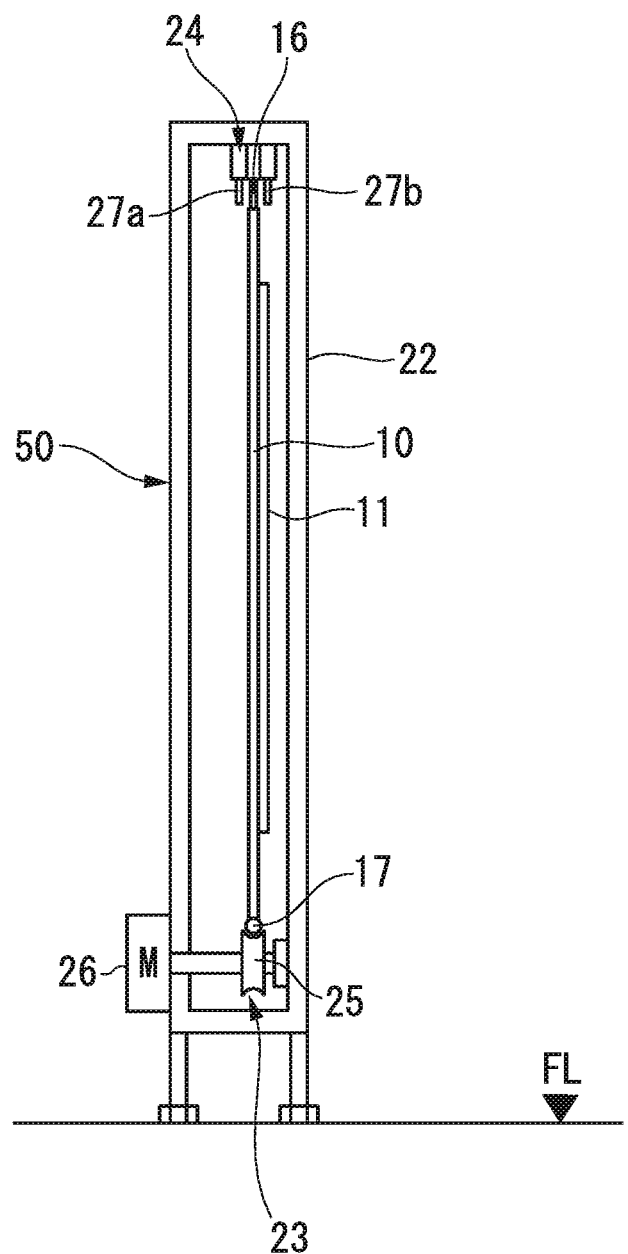
FIG. 2 is a side view showing a state in which the carrier according to the first embodiment of the present invention is placed on a conveyor.

FIG. 1 is a perspective view showing a carrier of the present embodiment, FIG. 2 is a side view showing a state in which a carrier of the present embodiment is placed on a conveyor, and reference numeral 10 in FIG. 1 denotes a carrier.

Regarding the carrier 10 according to the present embodiment, as shown in FIG. 1, when a substrate, for example, a glass substrate 11 is subjected to deposition or the like, the glass substrate 11 is placed on a frame body called the carrier 10 and the carrier 10 is appropriately processed while being transferred by a conveyor to be described below. As the substrate 11, a thin glass substrate, a resin substrate, or the like can also be used.

The carrier 10 may be used, for example, in a carrier circulation type in-line sputtering apparatus. Also, the carrier 10 can also be applied to an inter-back type sputtering apparatus. Further, the carrier 10 can also be applied to a vertical type single-wafer-processing apparatus (fixed film formation apparatus).

The carrier 10 is configured such that the glass substrate 11 is placed in a state in which the carrier is disposed vertically. That is, the carrier 10 holds the glass substrate 11 substantially vertically so that one surface (front surface) 11a of the glass substrate 11 is in a substantially vertical direction V. The carrier 10 includes a frame-shaped carrier frame 15 made of aluminum or the like, a magnet 16 provided to follow an upper side of the carrier frame 15, and a slider 17 made of a round bar provided to follow a lower side of the carrier frame 15.

Also, the carrier 10 includes a plurality of substrate guides 100 for receiving a load of the glass substrate 11 and maintaining levelness of the glass substrate 11, and a plurality of clamps 19 provided at a peripheral edge of an opening 21 of the carrier frame 15 so that the glass substrate 11 is held by the carrier 10. With such a configuration, the carrier frame 15 is in contact with at least a peripheral edge portion of the glass substrate 11 and supports the glass substrate 11. Further, a mask 20 for covering a non-deposition region of the peripheral edge of the glass substrate 11 is integrally formed with the carrier frame 15 at the peripheral edge of the opening 21 of the carrier frame 15. The plurality of substrate guides 100 in contact with a bottom side of the glass substrate 11 to receive the glass substrate 11 are formed in a lower portion of the carrier frame 15.

When the glass substrate 11 is placed on the carrier 10, for example, the glass substrate 11 is suctioned and held by a robot arm (not shown) and inserted such that the glass substrate 11 is inserted from a lateral side of the vertical carrier frame 15.

Further, the carrier frame 15 is not limited to a configuration in which one surface 11a of the glass substrate 11 is held in an accurately vertical direction. The carrier frame 15 may be configured to hold the glass substrate 11 in a substantially vertical direction inclined by several degrees from the vertical direction.

Also, the carrier 10 is not limited to the above-described configuration as long as the substrate guides 100 to be described below are configured to be provided in the carrier frame 15.

As shown in FIG. 2, the carrier 10 is placed in a vacuum chamber 50 constituting a film formation apparatus (not shown). The carrier 10 may be circularly transferred through, for example, a plurality of vacuum chambers constituting a vertical transfer type vacuum film formation apparatus, an atmospheric transfer conveyor which performs a transfer in an atmospheric pressure environment, and the like.

The vacuum chamber 50 includes, for example, a frame 22 supported by and fixed to a floor FL, and a lower support mechanism 23 and an upper support mechanism 24 provided in the frame 22. Thereby, when the slider 17 provided on a lower side of the carrier 10 is engaged with a roller 25 of the lower support mechanism 23 and the roller 25 is rotationally driven by a motor 26, the carrier 10 can be horizontally moved along a transfer path (a groove portion on an outer peripheral side of the roller 25). Also, the carrier 10 is configured to be transferable in a state of being held vertically due to the magnet 16 provided on an upper side of the carrier 10 and a pair of magnets 27a and 27b constituting the upper support mechanism 24 repelling each other.

Figure 3:
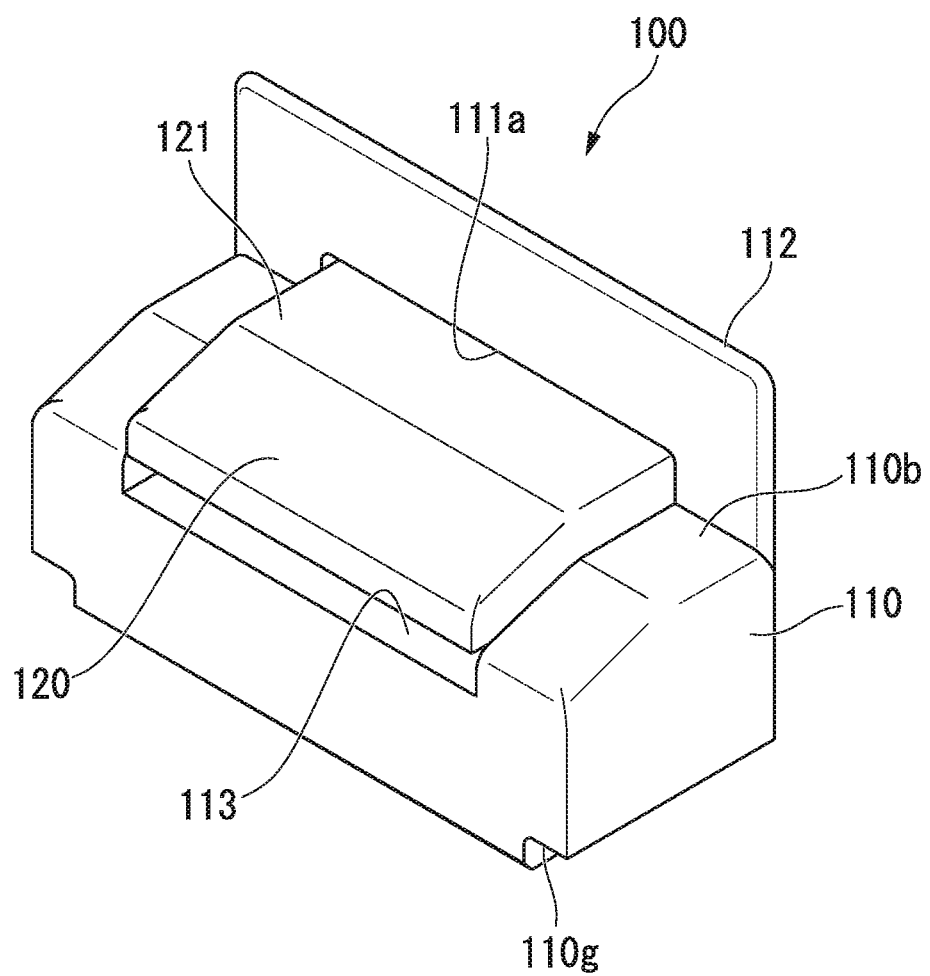
FIG. 3 is a perspective view showing a substrate guide according to the first embodiment of the present invention.
Figure 4:
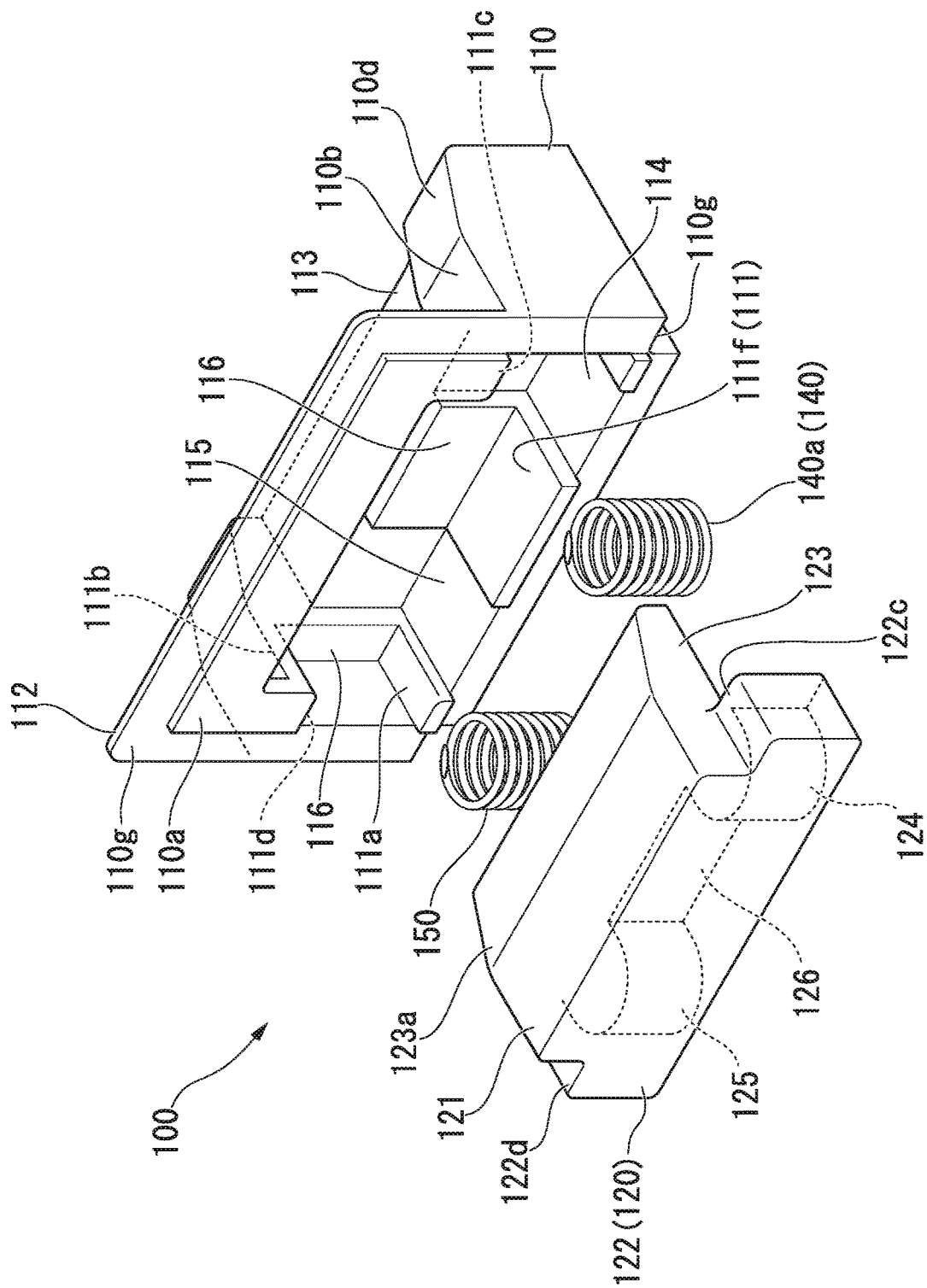
FIG. 4 is an exploded perspective view showing the substrate guide according to the first embodiment of the present invention.
Figure 5:
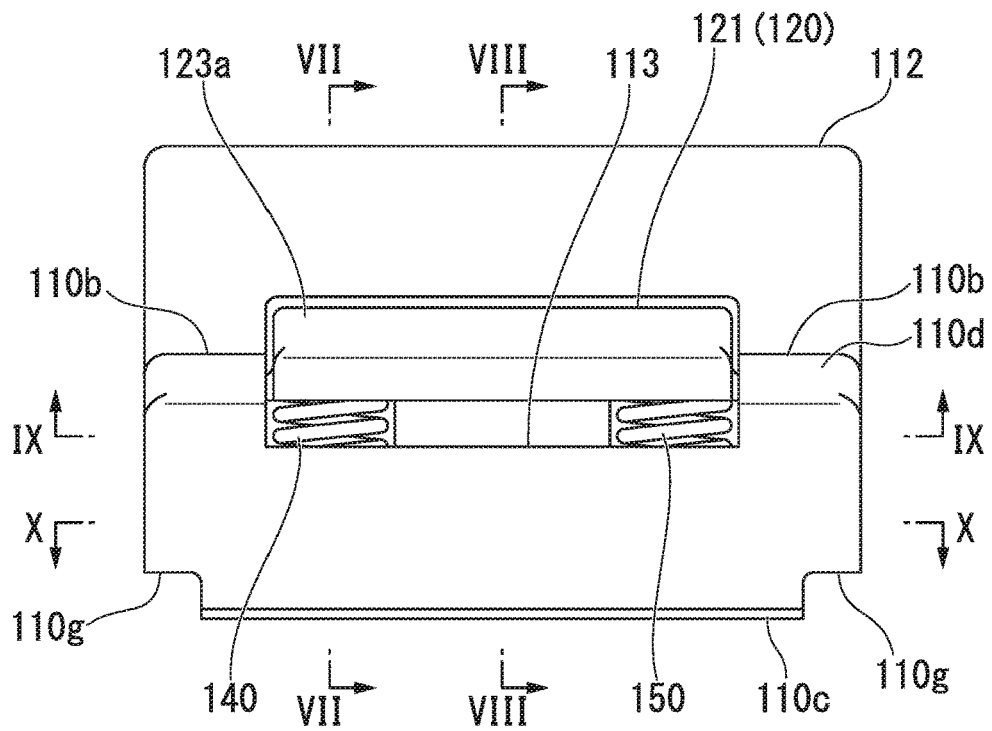
FIG. 5 is a front view showing the substrate guide according to the first embodiment of the present invention.

FIG. 3 is a perspective view showing a substrate guide of the present embodiment. FIG. 4 is an exploded perspective view showing the substrate guide of the present embodiment. FIG. 5 is a front view showing the substrate guide of the present embodiment. FIGS. 6 to 10 are cross-sectional views respectively taken along arrows shown in FIG. 5. In FIGS. 3 to 10, reference numeral 100 denotes the substrate guide.

As shown in FIG. 1, the substrate guide 100 according to the present embodiment is provided in the carrier frame 15 of the carrier 10 that holds the glass substrate 11 substantially vertically so that one surface 11a (surface) of the glass substrate 11 is in a substantially vertical direction. The substrate guide 100 comes into contact with at least a peripheral edge end surface portion 11b of the glass substrate 11 to support the glass substrate 11.

As shown in FIGS. 3 to 10, the substrate guide 100 includes a base 110, a substrate support 120, and coil springs (force-applying members) 140 and 150.

The base 110 and the substrate support 120 are made of a resin having heat resistance and vacuum resistance with respect to a process such as sputtering and having a strength capable of supporting the glass substrate 11, and may be made of, for example, a polyimide resin such as Vespel (registered trademark, manufactured by Du Pont).

The base 110 is attached to the carrier frame 15 and accommodates the substrate support 120 on which the glass substrate 11 is placed.

The substrate support 120 includes a planar support 121 that forms an upper surface of the substrate support 120. The substrate support 120 is accommodated in the base 110 so that the planar support 121 protrudes upward from a center of the base 110. The planar support 121 of the substrate support 120 comes into contact with the peripheral edge end surface portion 11b which is a lower end of the glass substrate 11 held by the carrier 10. The substrate support 120 is attached to the base 110 to be movable in the vertical direction along the one surface 11a of the glass substrate 11, that is, in a normal direction of the peripheral edge end surface portion 11b.

A force is applied upwardly to the substrate support 120 by the coil springs 140 and 150 with respect to the base 110 in a state where the substrate support 120 is accommodated in the base 110.

As shown in FIGS. 3 to 10, the base 110 is made of a resin and has a substantially rectangular parallelepiped shape elongated in a lateral direction. The base 110 has an internal space 111. The internal space 111 includes an opening 111a formed in a back surface 110a of the base 110 and an opening 111b formed in an upper surface 110b of the base 110. Inside the internal space 111, the substrate support 120 is accommodated. On the back surface 110a of the base 110, a plate-shaped contact portion 112 is provided to stand so that it extends upward from the base 110.

In the following description, the term "lateral direction" means a direction parallel to the substrate 11 placed on the substrate support 120. Also, a term "front-rear direction" means a direction perpendicular to the lateral direction.

Figure 6:
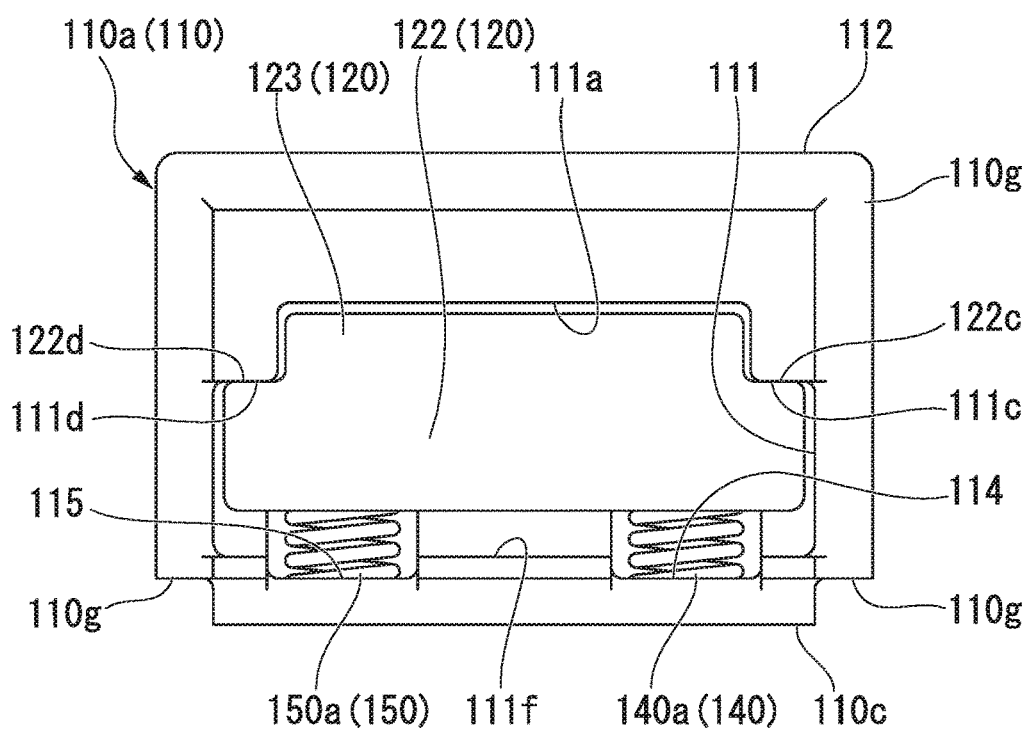
FIG. 6 is a rear view showing the substrate guide according to the first embodiment of the present invention.
Figure 7:
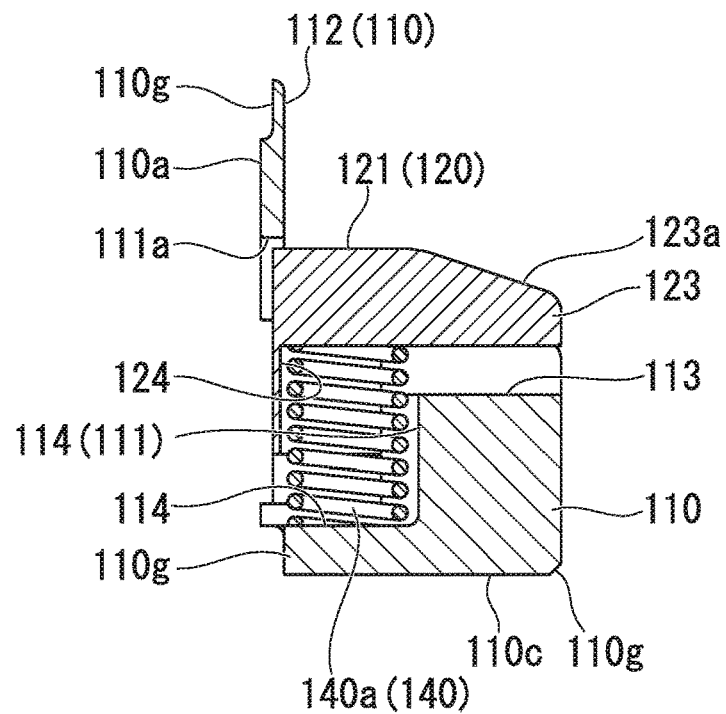
FIG. 7 is a cross-sectional view taken along line VII-VII in FIG. 5.
Figure 8:
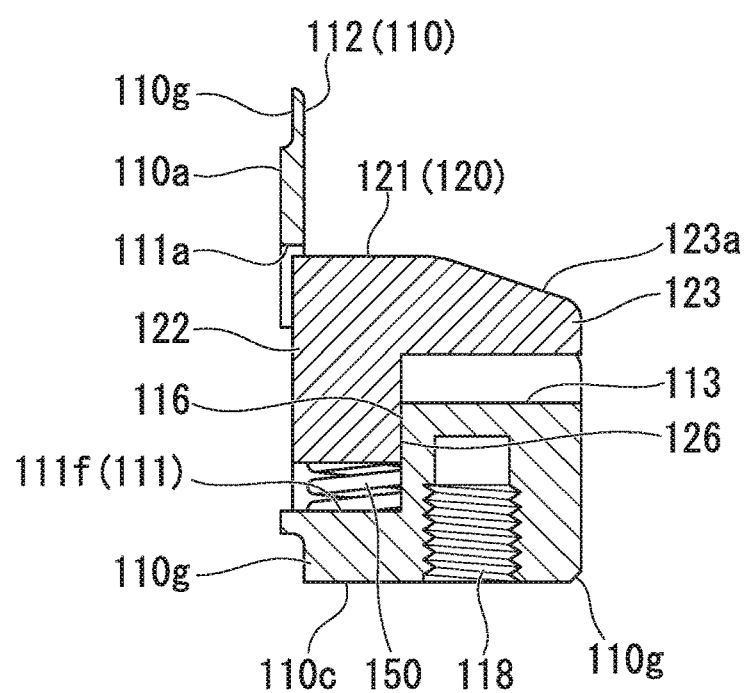
FIG. 8 is a cross-sectional view taken along line VIII-VIII in FIG. 5.

As shown in FIG. 6, the internal space 111 of the base 110 has a substantially rectangular cross section in a rear view. As shown in FIGS. 4, 7, and 8, the internal space 111 has a substantially rectangular cross section also in the front-rear direction so that the entire internal space 111 is open on the back surface 110a. The internal space 111 in the front-rear direction of the base 110 is formed to have a length smaller than approximately half of a length of the internal space 111 on the back surface 110a.

As shown in FIGS. 4 and 6, the internal space 111 of the base 110 is open such that both left and right ends of the base 110 positioned close to the upper surface 110b are left. On an upper side of the internal space 111, an upper groove 113 extending in the front-rear direction is formed. A length of the upper groove 113 in the lateral direction is equal to an entire length of the internal space 111 in the lateral direction. The upper groove 113 is formed on the upper surface 110b of the base 110.

As shown in FIGS. 4 and 6, in the internal space 111 of the base 110, position restricting surfaces 111c and 111d are provided at both left and right ends of the upper surface 110b. The position restricting surfaces 111c and 111d are in contact with the substrate support 120 and restrict an upper end position in a moving direction of the substrate support 120. The position restricting surfaces 111c and 111d are formed substantially horizontally and are formed in the same plane.

In the internal space 111 of the base 110, accommodating recesses 114 and 115 are provided on a bottom portion 111f so as to correspond to both end positions of the upper grooves 113. The accommodating recesses 114 and 115 extend in the front-rear direction and accommodate lower end portions 140a and 150a of the coil springs 140 and 150.

The accommodating recesses 114 and 115 are also provided on a front side surface of the internal space 111 to have the same width dimensions as those in the bottom portion 111f. Upper ends of the accommodating recesses 114 and 115 form a contour of the opening 111b.

In the internal space 111 of the base 110, a portion of a front side surface in which the accommodating recesses 114 are 115 are not provided is a movement position restricting sliding surface 116 that is in contact with the substrate support 120 for restricting the moving direction of the substrate support 120. The movement position restricting sliding surface 116 is a substantially vertical surface extending in the lateral direction. An upper end of a central portion in the lateral direction of the movement position restricting sliding surface 116 forms a contour of the opening 111b.

The movement position restricting sliding surface 116 formed as a vertical surface and a bottom surface of the upper groove 113 formed as a horizontal surface are formed to be perpendicular to each other.

The upper surface 110b of the base 110 which is both the left and right sides of the upper groove 113 is positioned below the planar support 121 of the substrate support 120 as will be described below and is formed not to protrude upward from the planar support 121. Also, an inclined surface 110d substantially parallel to an inclined surface 123a of the substrate support 120 is formed on a front end side of the upper surface 110b as will be described below. The inclined surface 110d is formed such that it is not positioned above the inclined surface 123a.

Accordingly, the base 110 has a contour shape separated from the glass substrate 11 placed on the planar support 121 of the substrate support 120 except for the contact portion 112.

The contact portion 112 has a substantially rectangular contour shape when viewed from the back surface 110a side and is configured to have a size in which the substrate 11 placed on the substrate guide 100 does not come into contact with the carrier frame 15. Specifically, as shown in FIGS. 4 and 6, the contact portion 112 is provided to stand upward from an end portion on the back surface 110a of the upper surface 110b of the base 110, and has a width equal to a length of the upper surface 110b in a lateral direction.

Also, a lower side of a central portion of the contact portion 112 corresponds to a shape of the internal space 111. A shape of the contact portion 112 has a shape having a cutout along the opening 111a so that contours of the opening 111a and the opening 111b are formed according to shapes of the internal space 111 and the upper groove 113.

An attachment screw hole 118 for attaching the substrate guide 100 to the carrier 10 is provided in the vertical direction at a central position in the lateral direction of a lower surface 110c of the base 110.

As shown in FIGS. 3 to 10, a step 110g is provided on the back surface 110a of the base 110 so that an entire periphery of the back surface 110a has a setback. Similarly, the step 110g is provided on the lower surface 110c of the base 110 so that an entire periphery of the base 110 has a setback. When the substrate guide 100 is attached to the carrier frame 15, a gap is formed in an attachment portion between the carrier frame 15 and the base 110 due to these steps 110g. With this structure, an unnecessary deposition component formed at a corner portion formed by the carrier frame 15 and the base 110 caused by a deposition gas does not affect the glass substrate 11 during a deposition process.

The substrate support 120 includes the planar support 121 that comes into contact with the peripheral edge end surface portion 11b when the glass substrate 11 is placed on an uppermost surface of the substrate support 120. A lower end side of the substrate support 120 is an accommodating portion 122 that is accommodated in the internal space 111.

The accommodating portion 122 is positioned close to the back surface 110a and extends downward along the internal space 111, and has a length in the front-rear direction equal to a length in the front-rear direction of the internal space 111. Also, the planar support 121 corresponding to an upper end side of the opening 111a includes a placing portion 123. The placing portion 123 extends toward a front side along the upper groove 113 and is formed to cover an entire portion in the front-rear direction of the base 110.

As shown in FIG. 8, the accommodating portion 122 and the placing portion 123 have an L-shaped cross section.

As shown in FIGS. 4 to 6, the accommodating portion 122 has a cross-sectional shape that is substantially equal to the internal space 111 in a plan view. Upper sides of both ends in the lateral direction of the accommodating portion 122 are position restricting surfaces 122c and 122d which correspond to the position restricting surfaces 111c and 111d and can be in contact with the position restricting surfaces 111c and 111d from below. The position restricting surfaces 122c and 122d are formed substantially horizontally and formed in the same plane. The position restricting surfaces 122c and 122d are positioned below the planar support 121 and protrude in the lateral direction with respect to the planar support 121.

An inner side portion between the position restricting surface 122c and the position restricting surface 122d in the lateral direction of the accommodating portion 122 is the placing portion 123 which protrudes upward with respect to the position restricting surfaces 122c and 122d, has a length in the lateral direction approximately equal to a length in the lateral direction of the upper groove 113, and is formed to protrude in a forward direction.

As shown in FIG. 4, on both end sides in the lateral direction of the accommodating portion 122, accommodating recesses 124 and 125 for accommodating the coil springs 140 and 150 are provided to extend vertically at positions corresponding to both end positions of the upper groove 113.

In the accommodating recesses 124 and 125, a portion corresponding to the back surface 110a and an upper side are closed and a lower end side and a front side are open. In a state in which the lower end portions 140a and 150a of the coil springs 140 and 150 protrude toward a lower side of the accommodating recesses 124 and 125, the accommodating recesses 124 and 125 can accommodate the coil springs 140 and 150.

Upper sides of the accommodating recesses 124 and 125 are at positions substantially equal to a lower end of the placing portion 123 and formed in a horizontal plane.

Portions of the accommodating recesses 124 and 125 that correspond to the back surface 110a have semicircular horizontal cross sections which are substantially equal to contour shapes of the coil springs 140 and 150 near the back surface 110a. The accommodating recesses 124 and 125 are formed such that the coil springs 140 and 150 and the substrate support 120 do not move in a horizontal direction even when the coil springs 140 and 150 extend and contract in the accommodating recesses 124 and 125.

As shown in FIG. 4, between the accommodating recess 124 and the accommodating recess 125 in the lateral direction of a front side surface of the accommodating portion 122, a movement position restricting sliding surface 126 that is slidable relative to the movement position restricting sliding surface 116 of the base 110 is formed. The movement position restricting sliding surface 126 is a substantially vertical surface extending in the lateral direction.

When the movement position restricting sliding surface 126 and the movement position restricting sliding surface 116 slide, a moving direction of the substrate support 120 with respect to the base 110 can be restricted in the vertical direction.

Also, as shown in FIGS. 3 to 10, the upper end of the central portion in the lateral direction of the movement position restricting sliding surface 116 is at a position substantially equal to the lower end of the placing portion 123, and is a straight line extending in the horizontal direction.

Figure 9:
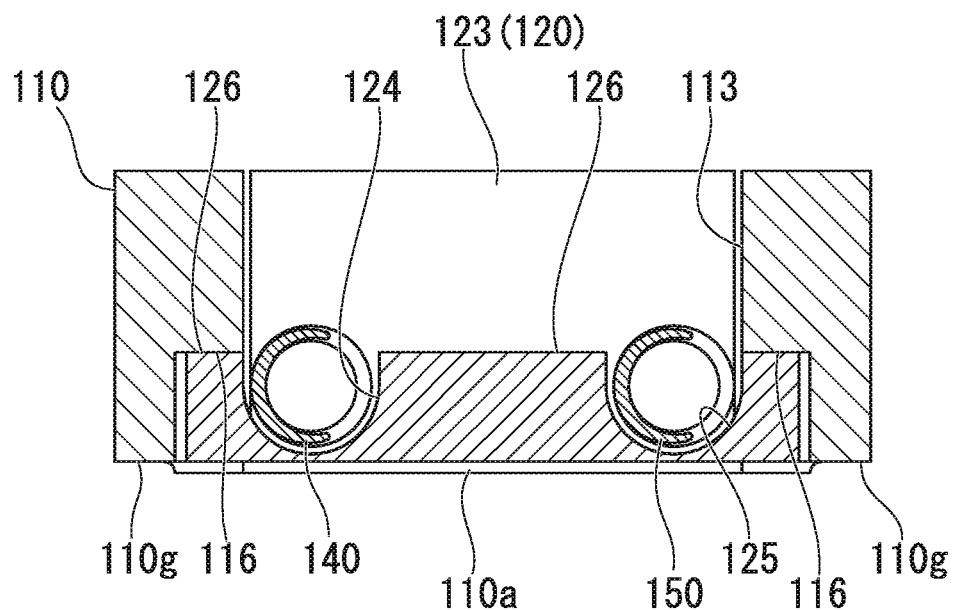
FIG. 9 is a cross-sectional view taken along line IX-IX in FIG. 5.
Figure 10:
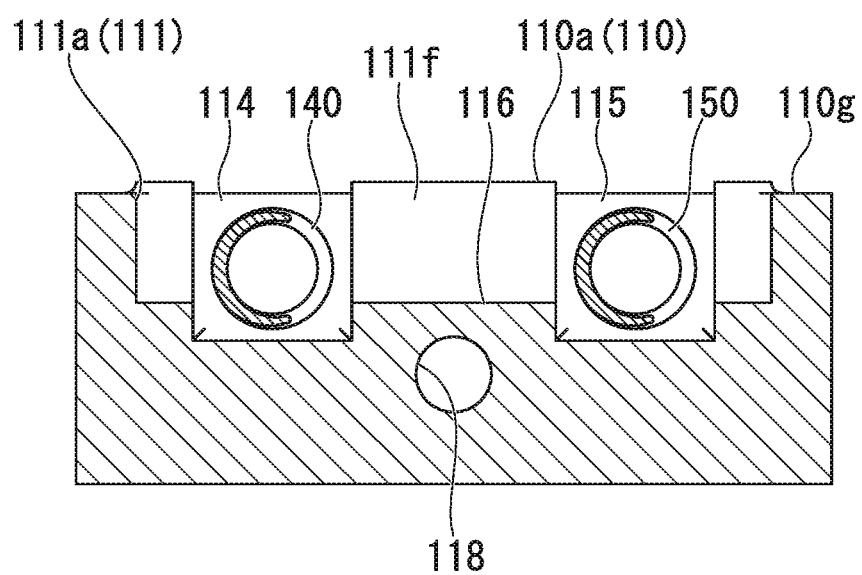
FIG. 10 is a cross-sectional view taken along line X-X in FIG. 5.

As shown in FIG. 9, the movement position restricting sliding surface 126 that is slidable relative to the movement position restricting sliding surface 116 of the base 110 is formed also on the front side surface of the accommodating portion 122 which is an outer side in the lateral direction of the accommodating recesses 124 and 125.

A portion of an upper side of the placing portion 123 close to the back surface 110a is a planar support 121 which is a horizontal plane. In the upper side of the placing portion 123, the inclined surface (surface) 123a is formed on a front surface side of the planar support 121. The inclined surface 123a is connected to the planar support 121 and is inclined downward from the planar support 121. The inclined surface 123a is formed to be gradually separated from the planar support 121 toward a front side end portion in the vertical direction from a position of the glass substrate 11 placed on the planar support 121.

As shown in FIGS. 3 to 10, a boundary portion between the inclined surface 123a and the planar support 121 has a smooth surface shape such that it does not have a sharp corner, and the inclined surface 123a and the planar support 121 are connected via the boundary portion. Also, the front side end portion and left and right end portions of the inclined surface 123a are also formed to have a shape in which corners are smoothly rounded such that they do not have a sharp corner. Similarly, right and left end portions of the planar support 121 are also formed to have a shape in which corners are smoothly rounded such that they do not have a sharp corner.

A thickness of the placing portion 123 is set such that the front side end portion of the inclined surface 123a is positioned above the upper surface 110b of the base 110.

Further, although the inclined surface 123a can be formed as a flat surface inclined from the planar support 121, the inclined surface 123a can also be formed as a curved surface lowered from the planar support 121 toward the front side.

As shown in FIGS. 3 to 10, the placing portion 123 is positioned in the upper groove 113. In the placing portion 123, a length of a portion disposed in the upper groove 113 in the front-rear direction is set to be equal to an entire length of the upper groove 113. The front side end portion of the placing portion 123 is on the same plane with a front surface of the base 110.

An end portion of the placing portion 123 positioned on the back surface 110a is positioned inside the opening 111a formed in the contact portion 112 and is formed to be hidden under the contact portion 112 when viewed from above.

When viewed from above, a length (length in the front-rear direction) of the placing portion 123 is set to cover substantially the entire region of the upper groove 113 of the base 110. The placing portion 123 is movable in the upper groove 113 in the vertical direction.

Further, although a side surface in the lateral direction of the placing portion 123 and a side surface of the upper groove 113 may be made slidable relative to each other in a state in which they are in contact with each other, width dimensions of the placing portion 123 and the upper groove 113 can also be set such that the side surface in the lateral direction of the placing portion 123 and the side surface of the upper groove 113 have a minute gap.

As shown in FIGS. 3 to 10, both the coil springs 140 and 150 are formed in a columnar shape having substantially the same diameter and have approximately the same biasing force. Between the substrate support 120 and the base 110 which are combined together, the coil spring 140 is disposed in a space formed by the accommodating recess 124 of the substrate support 120 and the accommodating recess 114 of the base 110 which are disposed at positions facing each other. In this space, the coil spring 140 is reduced in coil length to have a predetermined biasing force and is accommodated in a state of being extendable and contractible in an axial direction.

Similarly, between the substrate support 120 and the base 110 which are combined together, the coil spring 150 is disposed in a space formed by the accommodating recess 125 of the substrate support 120 and the accommodating recess 115 of the base 110 which are disposed at positions facing each other. In this space, the coil spring 150 is reduced in coil length to have a predetermined biasing force and is accommodated in a state of being extendable and contractible in an axial direction.

These coil springs 140 and 150 having the same biasing force are aligned in the lateral direction of the substrate support 120, and are disposed at symmetrical positions with respect to a central line of the substrate guide 100 parallel to the front-rear direction. Thereby, in a state in which a posture of the substrate support 120 is held with respect to the base 110, the substrate support 120 is movable up and down with respect to the base 110. At this time, since both the coil springs 140 and 150 have substantially the same biasing force, the coil springs 140 and 150 are not inclined in the lateral direction when the substrate support 120 moves up and down.

In the present embodiment, the two coil springs are provided at symmetrical positions with respect to the central line of the substrate guide 100 parallel to the front-rear direction such that the two coil springs are aligned in the lateral direction of the substrate support 120. A disposition of the two coil springs is not limited to the above-described disposition as long as it has a configuration in which the biasing force on the substrate support 120 is uniform in the lateral direction and the front-rear direction. For example, it is also possible to dispose three coil springs in the lateral direction or an additional coil spring in the front-rear direction.

It is preferable that central axes of the coil springs 140 and 150 be disposed at positions intersecting the planar support 121 and be positioned near a center in the front-rear direction of the planar support 121.

Also, the central axes of the coil springs 140 and 150 are disposed closer to the back surface 110a than the movement position restricting sliding surface 116 and the movement position restricting sliding surface 126 which are in contact with each other are.

Front side edge portions of the coil springs 140 and 150 are disposed at positions away from the back surface 110a, that is, at positions on a front side of the movement position restricting sliding surface 116 and the movement position restricting sliding surface 126 which are in contact with each other.

Edge portions of the coil springs 140 and 150 positioned close to the back surface 110a are disposed at positions behind a front surface of the contact portion 112.

Next, a method of placing the glass substrate 11 on the carrier 10 having the substrate guide 100 of the present embodiment will be described.

Figure 11:
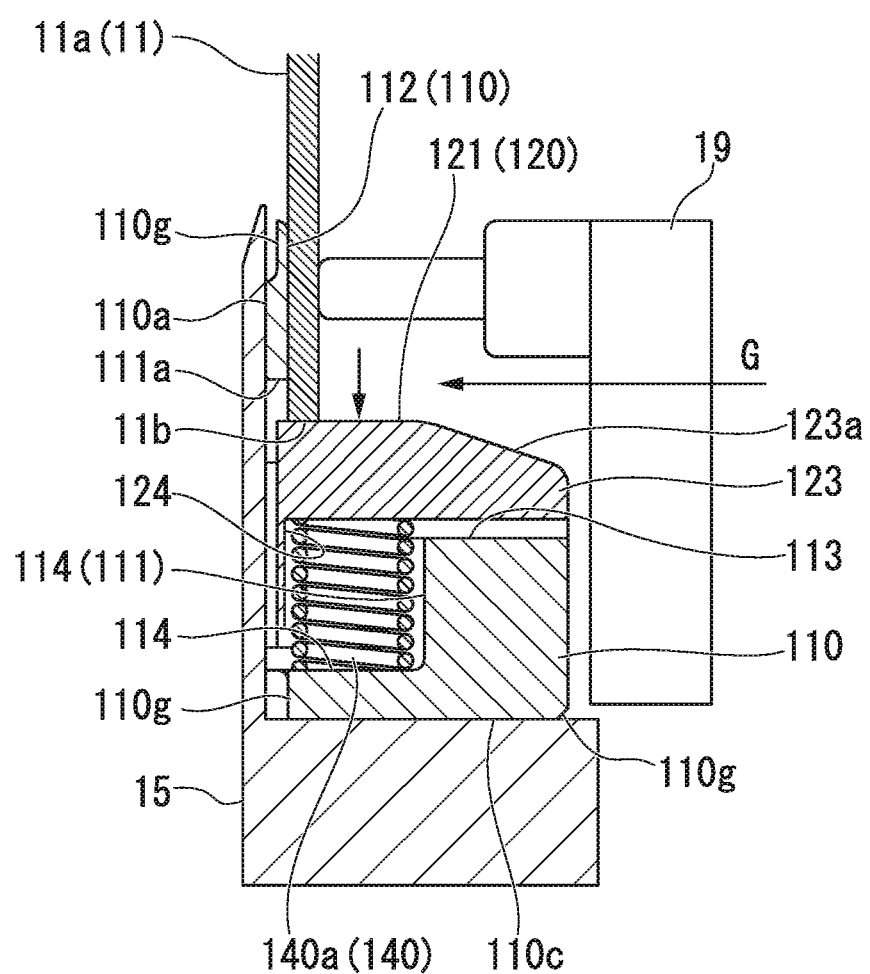
FIG. 11 is a cross-sectional view showing a state in use of the substrate guide according to the first embodiment of the present invention.

FIG. 11 is a cross-sectional view showing a state in use of the substrate guide of the present embodiment.

The substrate guide 100 according to the present embodiment supports the glass substrate 11 placed on the carrier 10.

When the glass substrate 11 is placed on the carrier 10, for example, the glass substrate 11 is suctioned and held by a robot arm (not shown) and inserted such that the glass substrate 11 is inserted from a lateral side of the vertical carrier frame 15.

Then, the glass substrate 11 moves from right to left in the drawing as shown by an arrow G in FIG. 11.

At this time, even when the peripheral edge end surface portion 11b of the glass substrate 11 is slightly deviated in the vertical direction, the peripheral edge end surface portion 11b is guided by the inclined surface 123a and the glass substrate 11 moves until reaching a position at which the peripheral edge end surface portion 11b is brought into contact with a surface on the planar support 121.

The planar support 121 of the substrate support 120 is a flat surface and there is no portion to come into contact with the peripheral edge end surface portion 11b above the planar support 121. Therefore, when the glass substrate 11 is placed on the carrier 10 as described above, a frictional force in a lateral direction, a load, or an impact is not unnecessarily applied to the peripheral edge end surface portion 11b.

Further, when the glass substrate 11 is moved in a left direction in FIG. 11, one surface 11a (front surface) of the glass substrate 11 comes into contact with the contact portion 112, and in this state, movement of the glass substrate 11 in the left direction is stopped.

Thereafter, when the holding by a robot arm or the like (not shown) is released, a weight of the glass substrate 11 is applied to the planar support 121.

At this time, in a state in which the moving direction of the substrate support 120 is restricted to move in the vertical direction due to sliding of the movement position restricting sliding surface 116 and the movement position restricting sliding surface 126, the coil springs 140 and 150 are compressed by the applied load, the coil length is reduced, and the substrate support 120 moves downward as shown by an arrow D in FIG. 11.

Due to the movement of the substrate support 120, a reaction force against the peripheral edge end surface portion 11b of the glass substrate 11 and an impact on the peripheral edge end surface portion 11b of the glass substrate 11 due to the load applied to the substrate support 120 can be alleviated.

In this manner, with a position of the glass substrate 11 restricted by the contact portion 112 and the planar support 121, the glass substrate 11 can be placed on the carrier 10 without giving an impact on the glass substrate 11.

Further, when the carrier 10 is moved in a state in which the glass substrate 11 is placed on the carrier 10, for example, even when a load/impact is applied to the peripheral edge end surface portion 11b of the glass substrate 11, since the load/impact on the peripheral edge end surface portion 11b of the glass substrate 11 is alleviated by the movement of the substrate support 120, occurrence of breakage/defects in the glass substrate 11 can be prevented.

When the glass substrate 11 is taken out from the carrier 10, for example, the placed glass substrate 11 is suctioned and held by a robot arm (not shown), and then extracted so that the glass substrate 11 is moved upward from the vertical carrier frame 15.

The planar support 121 of the substrate support 120 is a flat surface and there is no portion to come into contact with the peripheral edge end surface portion 11b above the planar support 121. Therefore, when the glass substrate 11 is extracted from the carrier 10 as described above, a frictional force in a lateral direction, a load, or an impact is not unnecessarily applied to the peripheral edge end surface portion 11b.

According to the carrier 10 having the substrate guide 100 according to the present embodiment, even when the glass substrate 11 is very heavy or very thin, or the glass substrate 11 is moved in a state of being deviated in a horizontal direction X from a predetermined holding position, since a load/impact on the peripheral edge end surface portion 11b of the glass substrate 11 is alleviated by the vertically movable substrate support 120 and the planar support 121 having a flat surface, occurrence of breakage/defects in the glass substrate 11 can be prevented.

Further, when the substrate guide 100 is provided at both end positions in a traveling direction of the carrier 10, that is, at front and rear positions thereof as shown in FIG. 1, a load/impact on the peripheral edge end surface portion 11b of the glass substrate 11 are similarly alleviated with respect to a load in the front-rear direction generated according to movement of the carrier 10, and thereby occurrence of breakage/defects in the glass substrate 11 can be prevented.

Further, as shown in FIG. 1, the substrate guide 100 is provided not only on the lower portion of the carrier frame 15 but also on a side portion of the carrier frame 15. That is, the substrate guide 100 can be in contact not only with the peripheral edge end surface portion 11b of the glass substrate 11 but also with a side surface portion (peripheral edge end surface portion) of the glass substrate 11. Specifically, a plurality of substrate guides 100 (four in the example shown in FIG. 1) are arranged in the vertical direction V on each of the side portions of the carrier frame 15.

When the glass substrate 11 is transferred in a state in which the glass substrate 11 is placed on the carrier frame 15 having such substrate guides 100, for example, when movement of the carrier frame 15 suddenly stops, the glass substrate 11 may be inclined in an oblique direction with respect to the vertical direction V by action of inertia of the glass substrate 11. At this time, the substrate guides 100 provided on the side portions of the carrier frame 15 can prevent occurrence of breakage/defects in the glass substrate 11 by alleviating a load/impact on the side surface portions of the glass substrate 11.

Further, the substrate guides 100 are provided on the side portions of the carrier frame 15 in the example shown in FIG. 1, but the number of carrier frames 15 can be appropriately changed according to a design. Also, the substrate guides 100 may be provided only on the lower portion of the carrier frame 15 without being provided on the side portions of the carrier frame 15.

When the carrier 10 as described above is used, for example, as a substrate transfer device of an in-line type sputtering apparatus, the large glass substrate 11 can be placed at a predetermined holding position without breakage/defects.

Second Embodiment

Hereinafter, a substrate guide according to a second embodiment of the present invention will be described with reference to the drawings.

Figure 12:
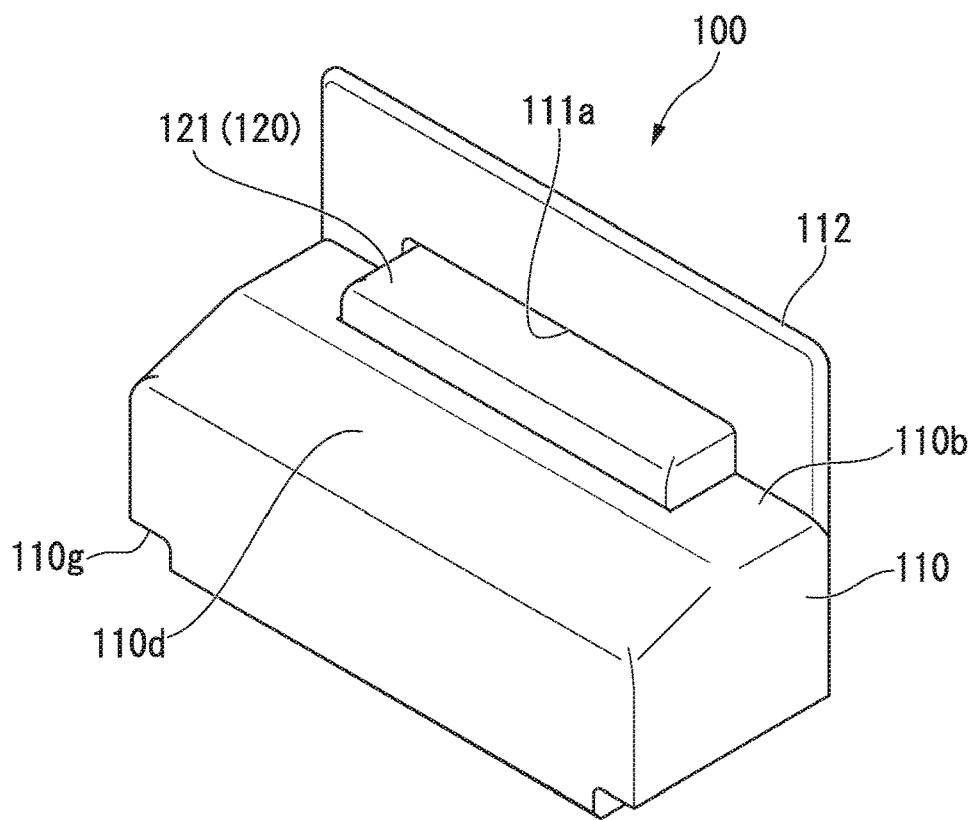
FIG. 12 is a perspective view showing a substrate guide according to a second embodiment of the present invention.
Figure 13:
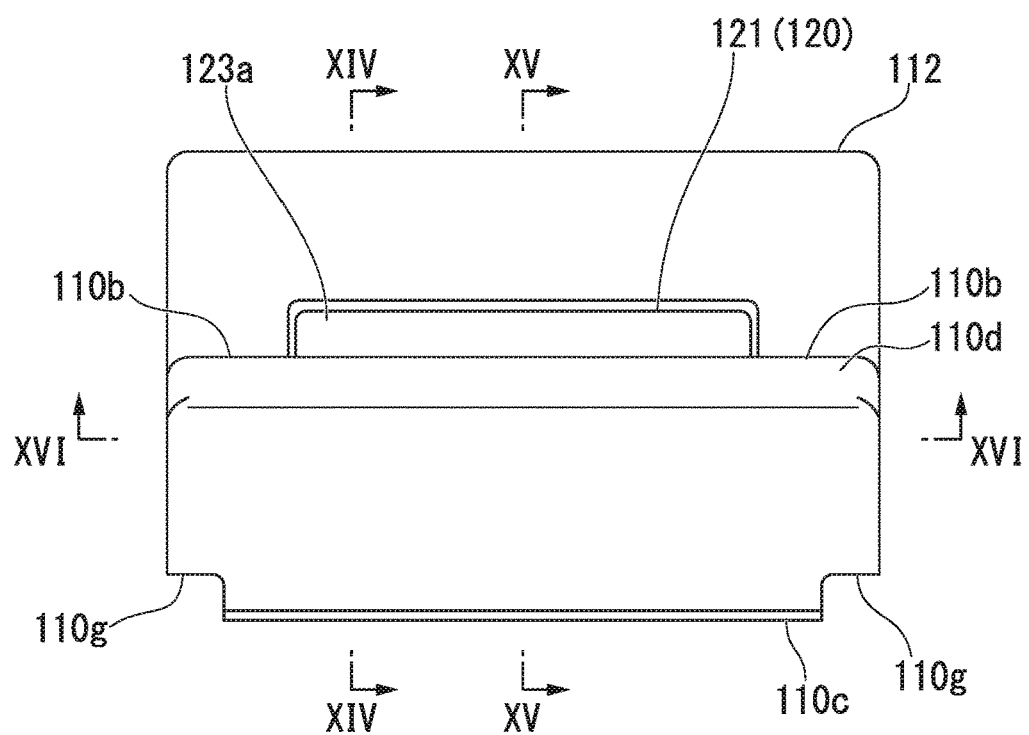
FIG. 13 is a front view showing the substrate guide according to the second embodiment of the present invention.
Figure 14:
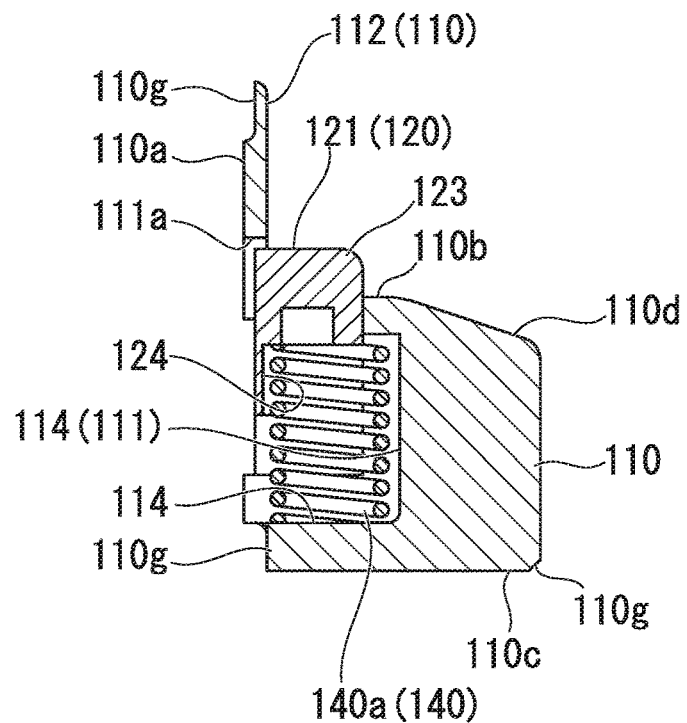
FIG. 14 is a cross-sectional view taken along line XIV-XIV in FIG. 13.
Figure 15:
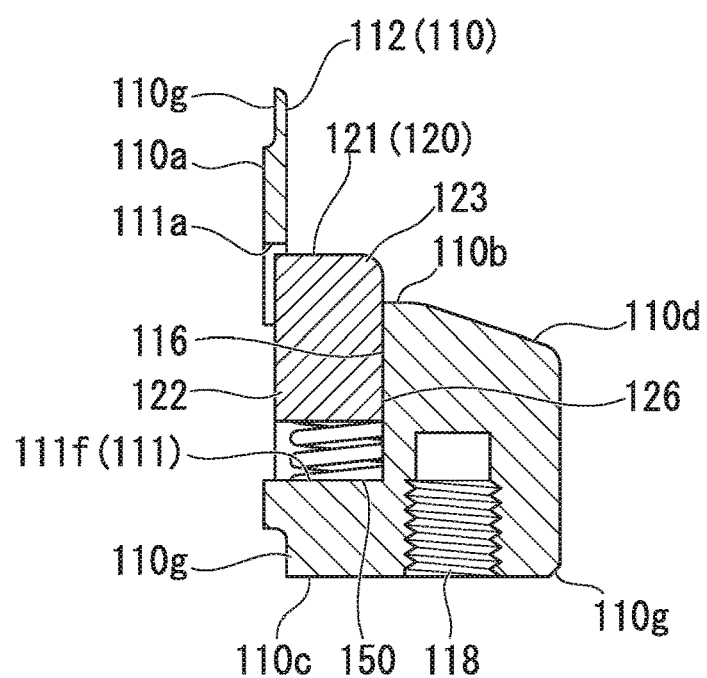
FIG. 15 is a cross-sectional view taken along line XV-XV in FIG. 13.
Figure 16:
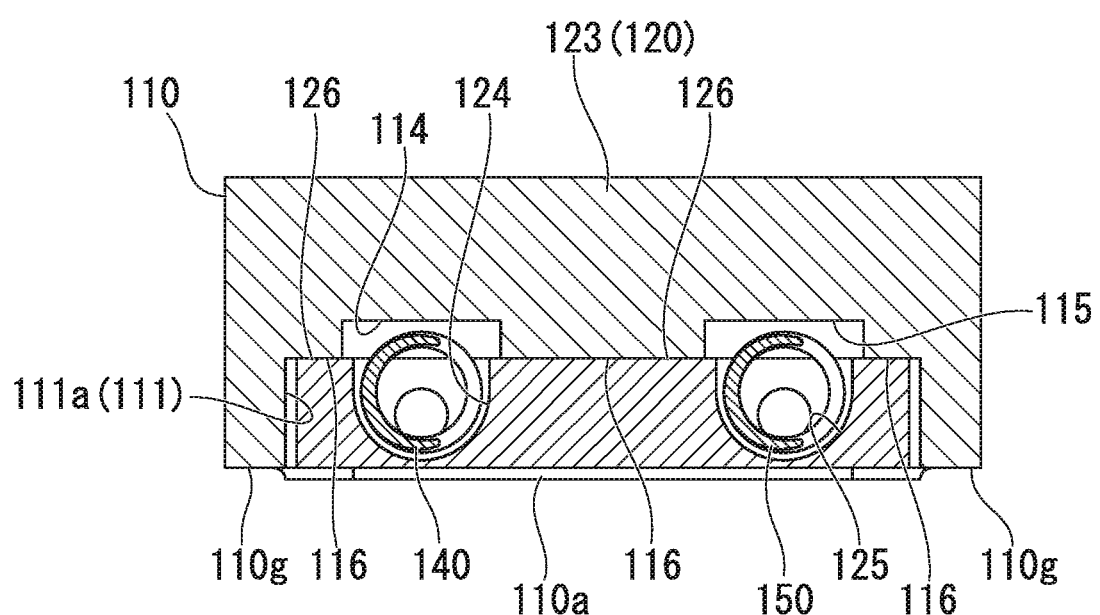
FIG. 16 is a cross-sectional view taken along line XVI-XVI in FIG. 13.

FIG. 12 is a perspective view showing a substrate guide of the present embodiment, and FIG. 13 is a front view showing the substrate guide of the present embodiment. FIGS. 14 to 16 are cross-sectional views respectively taken along arrows shown in FIG. 13. The present embodiment is different from the above-described first embodiment in terms of a length in a front-rear direction of the placing portion 123 of the substrate support 120 and a structure of the placing portion 123. Except for such differences, constituents corresponding to those in the above-described first embodiment will be denoted by the same reference numerals and a description thereof will be omitted.

In a substrate guide 100 according to the present embodiment, an upper groove is not provided in a base 110, and a length in a front-rear direction of a placing portion 123 is approximately the same as a length in a front-rear direction of an accommodating portion 122. In accordance with this, a length in a front-rear direction of a planar support 121 corresponds to an entire length in a front-rear direction of a substrate support 120.

Also, a width of an inclined surface 110d corresponds to an entire width of a front side end of the base 110.

According to the substrate guide 100 according to the present embodiment, similarly to the first embodiment, even when a glass substrate 11 is very heavy or very thin, or the glass substrate 11 is moved in a state of being deviated in a horizontal direction X from a predetermined holding position, since a load/impact on a peripheral edge end surface portion 11b of the glass substrate 11 is alleviated by the vertically movable substrate support 120 and the planar support 121 having a flat surface, occurrence of breakage/defects in the glass substrate 11 can be prevented.

INDUSTRIAL APPLICABILITY

As an application example of the present invention, the substrate guide can be attached not only to a carrier of sputtering apparatuses but also to a carrier of chemical vapor deposition (CVD) apparatuses or vapor film formation apparatuses.

DESCRIPTION OF REFERENCE NUMERALS

10 Carrier
11 Glass substrate (substrate)
11a Surface (one surface)
11b Peripheral edge end surface portion
15 Carrier frame
19 Clamp
100 Substrate guide
110 Base
110a Back surface
110b Upper surface
110d Inclined surface
110g Step
111 Internal space
111a, 111b Opening
111c, 111d Position restricting surface
111f Bottom portion
112 Contact portion
113 Upper groove
114, 115 Accommodating recess
116 Movement position restricting sliding surface
118 Attachment screw hole
120 Substrate support
121 Planar support
122 Accommodating portion
122c, 122d Position restricting surface
123 Placing portion
123a Inclined surface (surface)
124, 125 Accommodating recess
126 Movement position restricting sliding surface
140, 150 Coil spring (force-applying member)
140a, 150a Lower end portion

What is claimed is:

1. A substrate guide provided on a carrier frame of a carrier which holds a substrate substantially vertically so that a surface of the substrate is in a substantially vertical direction, the substrate guide supporting the substrate by being in contact with at least a peripheral edge end surface portion of the substrate, the substrate guide comprising:
   a base attached to the carrier frame;
   a substrate support which comes into contact with the peripheral edge end surface portion of the substrate held by the carrier and is attached to the base to be movable in a normal direction of the peripheral edge end surface portion in a direction parallel to the surface of the substrate, the substrate support including a planar support along the peripheral edge end surface portion; and
   at least one force-applying member which applies a force to the substrate support toward the substrate with respect to the base, wherein
   the substrate support and the base include movement position restricting sliding surfaces that slide relative to each other in a direction perpendicular to the planar support,
   the base includes a contact portion which comes into contact with the surface of the substrate adjacent to the peripheral edge end surface portion when the substrate is placed on the substrate support, and
   the contact portion extends in a direction away from the planar support in a moving direction of the substrate support.

2. The substrate guide according to claim 1, wherein the base has a contour shape separated from the planar support in the moving direction of the substrate support except for the contact portion.

3. The substrate guide according to claim 1, wherein a surface separated from the substrate in a direction along the surface of the substrate is connected to an end portion of the planar support separated from the contact portion.

4. The substrate guide according to claim 1, wherein a length of the substrate support in a direction from the peripheral edge end surface portion toward a position separated from the contact portion is set such that the substrate support covers the base.

5. The substrate guide according to claim 1, wherein the at least one force-applying members includes a first force-applying member and a second force-applying member, and the first and second force-applying members are provided at two end positions of the planar support of the substrate support in a peripheral direction of the peripheral edge end surface portion.

6. The substrate guide according to claim 5, wherein
the substrate support and the base include an accommodating recess in which an end portion of the force-applying member is accommodated.

7. The substrate guide according to claim 1, wherein the at least one force-applying members includes a first force-applying member and a second force-applying member, and the first and second force-applying members are columnar coil springs, and
central axes of the coil springs are disposed at positions intersecting the planar support.

8. The substrate guide according to claim 1, wherein
the at least one force-applying member is a columnar coil spring, and
a central axis of the coil spring is disposed at a position closer to the contact portion than the movement position restricting sliding surface is.

9. The substrate guide according to claim 1, wherein
the at least one force-applying member is a columnar coil spring, and
an edge portion of the coil spring is disposed at a position further away from the contact portion than from the movement position restricting sliding surface.

10. A carrier which holds a substrate substantially vertically so that a surface of the substrate is in a substantially vertical direction, the carrier comprising:
a carrier frame supporting the substrate by being in contact with at least a peripheral edge portion of the substrate, wherein
a plurality of substrate guides are disposed in the carrier frame; wherein the substrate guide provided on the carrier frame of a carrier which holds a substrate substantially vertically so that a surface of the substrate is in a substantially vertical direction, the substrate guide supporting the substrate by being in contact with at least a peripheral edge end surface portion of the substrate, the substrate guide comprising:
a base attached to the carrier frame;
a substrate support which comes into contact with the peripheral edge end surface portion of the substrate held by the carrier and is attached to the base to be movable in a normal direction of the peripheral edge end surface portion in a direction parallel to the surface of the substrate, the substrate support including a planar support along the peripheral edge end surface portion; and
at least one force-applying member which applies a force to the substrate support toward the substrate with respect to the base, wherein
the substrate support and the base include movement position restricting sliding surfaces that slide relative to each other in a direction perpendicular to the planar support,
the base includes a contact portion which comes into contact with the surface of the substrate adjacent to the peripheral edge end surface portion when the substrate is placed on the substrate support, and
the contact portion extends in a direction away from the planar support in a moving direction of the substrate support.

* * * * *